(12) United States Patent
Seki et al.

(10) Patent No.: US 8,498,173 B2
(45) Date of Patent: Jul. 30, 2013

(54) SEMICONDUCTOR DEVICE AND MEMORY SYSTEM COMPRISING THE SAME

(75) Inventors: Shigenobu Seki, Kawasaki (JP); Hiroshi Deguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 13/232,549

(22) Filed: Sep. 14, 2011

(65) Prior Publication Data
US 2012/0294105 A1 Nov. 22, 2012

(30) Foreign Application Priority Data
May 18, 2011 (JP) .................................. 2011-111513

(51) Int. Cl.
*G11C 5/14* (2006.01)
(52) U.S. Cl.
USPC ........... 365/226; 365/227; 365/228; 365/229; 365/189.09
(58) Field of Classification Search
USPC ...... 365/226, 227, 228, 229, 189.09; 327/541
See application file for complete search history.

(56) References Cited

U.S. PATENT DOCUMENTS

| 6,384,672 B2 * | 5/2002 | Oh ................................. 327/541 |
| 7,863,969 B2 * | 1/2011 | Furuya et al. ................. 327/541 |
| 2005/0280465 A1 * | 12/2005 | Morishita ..................... 327/541 |

FOREIGN PATENT DOCUMENTS

| JP | 5-28768 | 2/1993 |
| JP | 10-27026 | 1/1998 |
| JP | 11-250663 | 9/1999 |

* cited by examiner

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

According to an embodiment, a semiconductor device includes a power supply switch and a first regulator. One end of the power supply switch is connected to an input terminal. The other end of the power supply switch is connected to an output terminal. The first regulator includes a power supply terminal connected to the one end of the power supply switch, and a voltage output terminal connected to the other end of the power supply switch. The first regulator is configured to control a voltage of the voltage output terminal to approach a target voltage based on a voltage of the power supply terminal. The target voltage is switched to a first voltage or a second voltage. The first voltage is equal to or more than the voltage of the power supply terminal. The second voltage is lower than the voltage of the power supply terminal.

20 Claims, 10 Drawing Sheets

SEMICONDUCTOR DEVICE AND MEMORY SYSTEM COMPRISING THE SAME

CROSS REFERENCE TO RELATED APPLICATION

This application is based upon and claims the benefit of priority from the prior Japanese Patent Application No. 2011-111513 filed on May 18, 2011 in Japan, the entire contents of which are incorporated herein by reference.

FIELD

Embodiments described herein relate generally to a semiconductor device and a memory system comprising the same.

BACKGROUND

As a technique for low power consumption, there is known a technique for reducing a power supply voltage during a standby or low-speed operation of a memory system. However, the technique has a problem that a plurality of external power supplies are needed for supplying the power supply voltage. Further, a switch is used for changing over the power supply voltage, and when switch control is not sufficiently taken into consideration, a temporary interruption of the power supply or a rapid variation in voltage in a transition state can occur. For the memory system, destroyed memory data caused by the temporary interruption of the power supply or the rapid variation in voltage is a serious problem.

DETAILED DESCRIPTION

According to an embodiment, a semiconductor device is configured to output an internal power supply voltage from an output terminal based on an external power supply voltage supplied to an input terminal. The semiconductor device includes a power supply switch and a first regulator. One end of the power supply switch is connected to the input terminal. The other end of the power supply switch is connected to the output terminal. The power supply switch is controlled to be on or off. The first regulator includes a power supply terminal and a voltage output terminal. The power supply terminal is connected to the one end of the power supply switch. The voltage output terminal is connected to the other end of the power supply switch. The first regulator is configured to control a voltage of the voltage output terminal to approach a target voltage based on a voltage of the power supply terminal. The target voltage is switched to a first voltage or a second voltage. The first voltage is equal to or more than the voltage of the power supply terminal. The second voltage is lower than the voltage of the power supply terminal. After the power supply switch is controlled to be on and the target voltage of the first regulator is set at the first voltage, the power supply switch is controlled to be off. At or after the point in time when the power supply switch is controlled to be off, the target voltage of the first regulator is set at the second voltage.

Hereafter, embodiments according to the present invention will be described with reference to the drawings. The present invention is not limited to the embodiments.

First Embodiment

Figure 1:
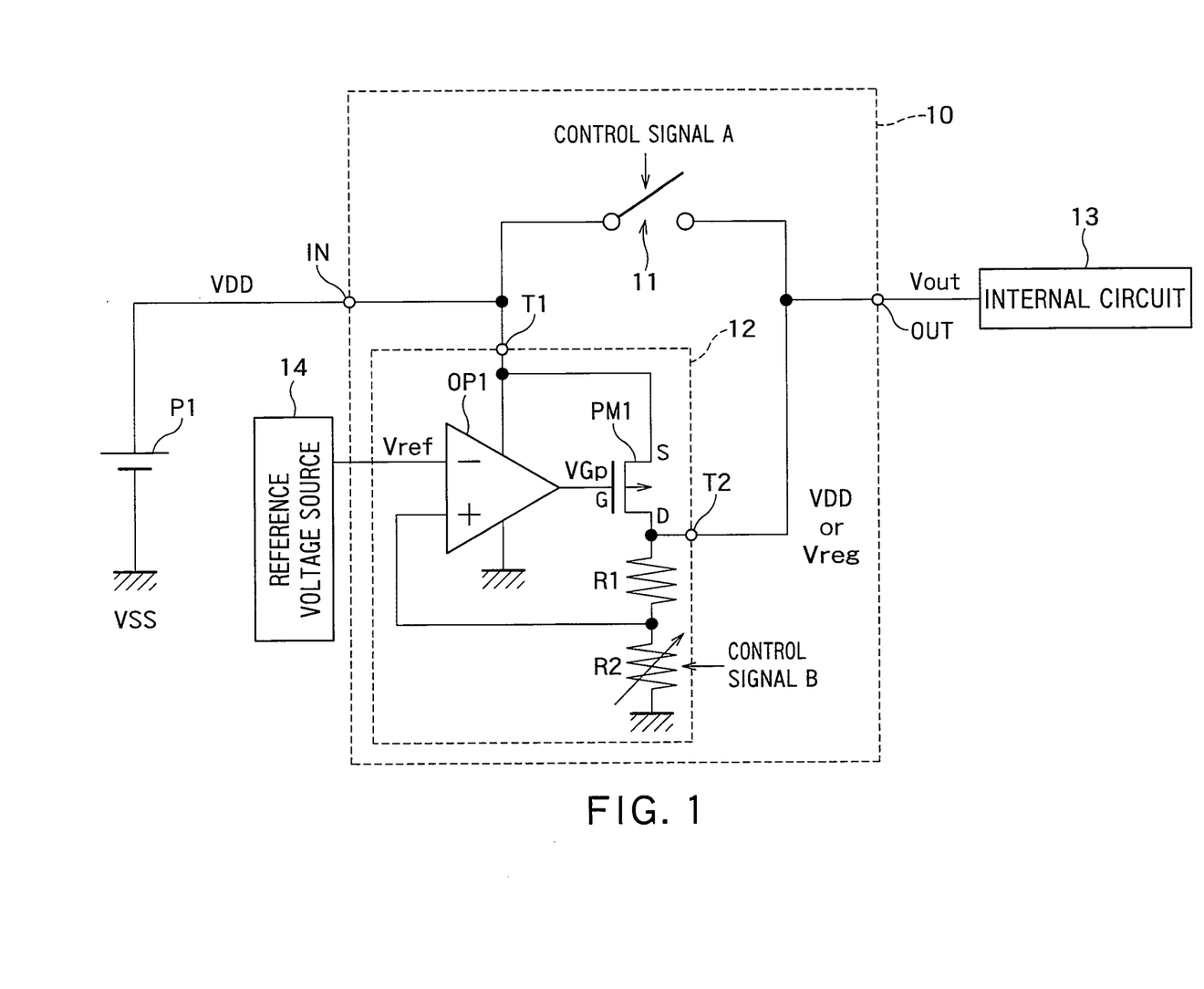
FIG. 1 is a circuit diagram showing a structure of a semiconductor device according to a first embodiment.

FIG. 1 is a circuit diagram showing a structure of a semiconductor device (power supply system) 10 according to a first embodiment. As shown in FIG. 1, the semiconductor device 10 comprises a power supply switch 11 and a first regulator 12.

The semiconductor device 10 outputs an internal power supply voltage Vout equal to or less than an external power supply voltage VDD from an output terminal OUT, based on the external power supply voltage VDD supplied from an external power supply P1 to an input terminal IN. The internal power supply voltage Vout is supplied to an internal circuit 13 as a power supply voltage for operating the internal circuit 13. The internal circuit 13 is switched between a normal operation state in which power consumption is high and either a standby state or low-speed operation state in which power consumption is low.

One end of the power supply switch 11 is connected to the input terminal IN, and the other end of the power supply switch 11 is connected to the output terminal OUT. The power supply switch 11 is controlled to be on or off by a control signal A. In the present embodiment, the power supply switch 11 is turned off when the control signal A is at a high level and is turned on when the control signal A is at a low level. Since the power supply switch 11 is used for power supply to the internal circuit 13 in the normal operation state, a low ON resistance is required so as to allow a large current to flow. Therefore, a large-sized MOS transistor is used as the power supply switch 11, for example.

The first regulator 12 has a power supply terminal T1 connected to one end of the power supply switch 11 and a voltage output terminal T2 connected to the other end of the power supply switch 11. The first regulator 12 is a step-down regulator and controls based on the external power supply voltage VDD of the power supply terminal T1 such that the internal power supply voltage Vout of the voltage output terminal T2 approaches a target voltage. The target voltage is switched to either a first voltage equal to or more than the external power supply voltage VDD or a second voltage Vreg lower than the external power supply voltage VDD by a control signal B.

The first regulator 12 has a P-type MOS transistor (power transistor) PM1, a first resistor R1, a second resistor R2 and an amplifier OP1.

A source (one end) S of the P-type MOS transistor PM1 is connected to the power supply terminal T1, and a drain (the other end) D of the P-type MOS transistor PM1 is connected to the voltage output terminal T2.

One end of the first resistor R1 is connected to the drain D of the P-type MOS transistor PM1. One end of the second resistor R2 is connected to the other end of the first resistor R1, and the other end of the second resistor R2 is grounded to a ground potential VSS (0 V). The second resistor R2 is a variable resistor capable of being switched to a high resistance value or a low resistance value by the control signal B. In the present embodiment, the second resistor R2 is at a high resistance value when the control signal B is at a high level and is at a low resistance value when the control signal B is at a low level.

The amplifier OP1 includes an inverting input terminal (first input terminal) configured to receive a reference voltage Vref from a reference voltage source 14, a non-inverting input terminal (second input terminal) connected to the other end of the first resistor R1, and an output terminal connected to a gate G of the P-type MOS transistor PM1. The amplifier OP1 operates using the external power supply voltage VDD of the power supply terminal T1 as the power supply voltage. In other words, the power supply terminal of the amplifier OP1 is connected to the power supply terminal T1.

The amplifier OP1 controls a voltage VGp of the gate G of the P-type MOS transistor PM1 such that the voltage of the non-inverting input terminal approaches the reference voltage Vref. Thereby, the internal power supply voltage Vout is controlled to approach the target voltage.

The target voltage is determined based on the first resistor R1, the second resistor R2 and the reference voltage Vref, and can be expressed as $(R_1/R_2+1)Vref$, where $R_1$ is a resistance value of the first resistor R1 and $R_2$ is a resistance value of the second resistor R2. The first resistor R1, the second resistor R2 and the reference voltage Vref are set such that the target voltage is set at the first voltage equal to or more than the external power supply voltage VDD when the second resistor R2 is set at a low resistance value, and the target voltage is set at the second voltage Vreg lower than the external power supply voltage VDD when the second resistor R2 is set at a high resistance value.

When the target voltage is set at the first voltage higher than the external power supply voltage VDD, the P-type MOS transistor PM1 keeps being ON and thus the first regulator 12 outputs the external power supply voltage VDD.

The first regulator 12 has only to have an ability to supply a current to the internal circuit 13 in the standby state or low-speed operation state. Thus, the P-type MOS transistor PM1 is small in size and the first regulator 12 consumes a small amount of power.

Figure 2:
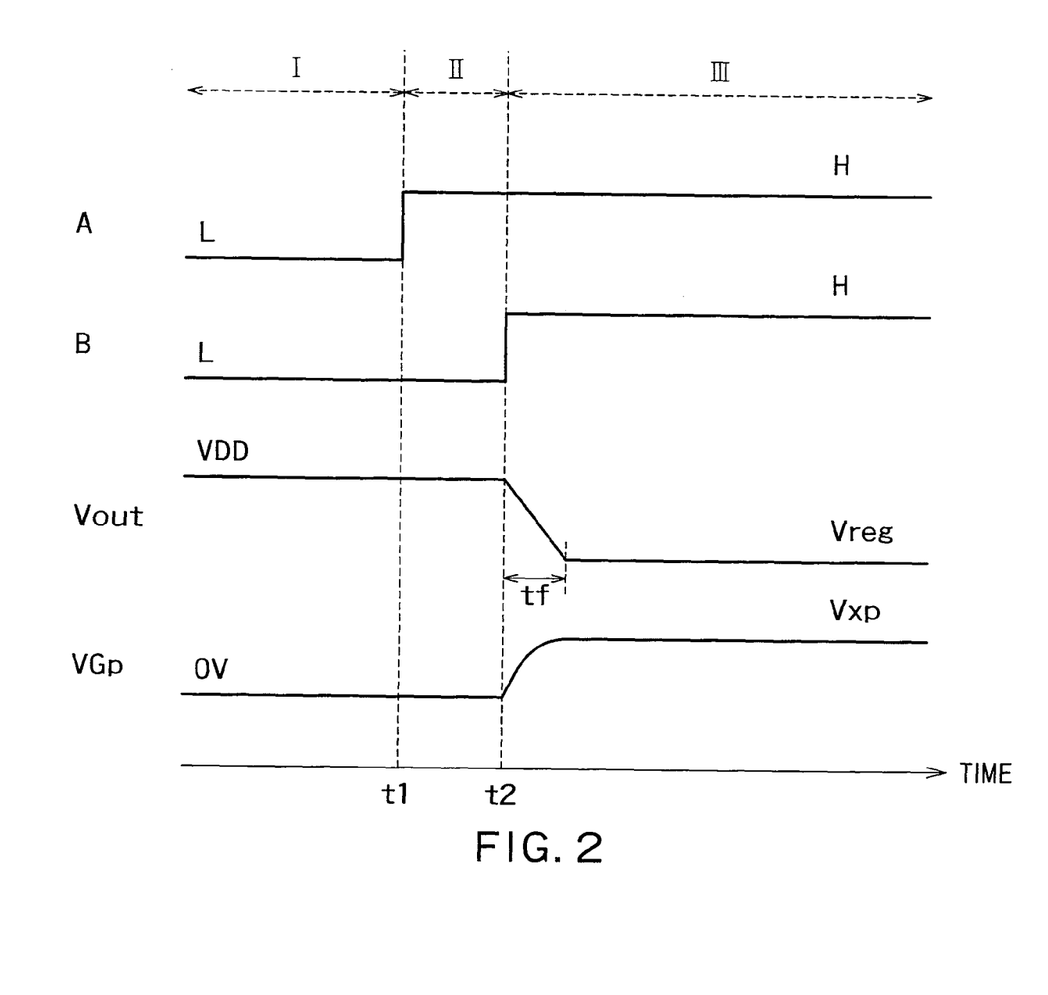
FIG. 2 is a waveform diagram showing a fall operation of the internal power supply voltage of the semiconductor device according to the first embodiment.

The operations of the semiconductor device 10 will be described below. FIG. 2 is a waveform diagram showing a fall operation of the internal power supply voltage Vout of the semiconductor device 10 according to the first embodiment.
(Period I: Before Time t1)

The internal circuit 13 is in the normal operation state. The control signal A and the control signal B are at a low level (L). Therefore, the power supply switch 11 is ON and thus the external power supply voltage VDD is output as the internal power supply voltage Vout via the power supply switch 11.

Since the second resistor R2 is set at a low resistance value, the target voltage of the first regulator 12 is at the first voltage higher than the external power supply voltage VDD. However, the first regulator 12 cannot output a voltage higher than the external power supply voltage VDD supplied to the power supply terminal T1. In other words, since the internal power supply voltage Vout at this time does not reach the target voltage, a voltage between the first resistor R1 and the second resistor R2 is lower than the reference voltage Vref. Thus, the output voltage VGp of the amplifier OP1 (the voltage of the gate of the P-type MOS transistor PM1) is fixed at 0 V as shown in FIG. 2. Therefore, since the P-type MOS transistor PM1 maintains the ON state, the external power supply voltage VDD is output as the internal power supply voltage Vout via the P-type MOS transistor PM1.

In other words, the internal power supply voltage Vout supplied to the internal circuit 13 becomes the external power supply voltage VDD as a result of the operations of both the power supply switch 11 and the first regulator 12. As described above, the current is supplied to the internal circuit 13 mainly via the power supply switch 11 which has a lower ON resistance than the P-type MOS transistor PM1.
(Period II: Time t1 and Thereafter, and Before Time t2)

Then, at time t1, the internal circuit 13 is changed to the standby state or the low-speed operation state, and the control signal A becomes the high level (H). The control signal B remains at the low level. Thus, the power supply switch 11 is turned off. Since the second resistor R2 is set at a low resistance value as in period I, the first regulator 12 outputs the external power supply voltage VDD as the internal power supply voltage Vout.

In other words, the internal power supply voltage Vout becomes the external power supply voltage VDD as a result of the operation of the first regulator 12.

Since even at time t1 at which the power supply switch 11 is turned off, the output voltage VGp of the amplifier OP1 is fixed at 0 V by a feedback operation, the P-type MOS transistor PM1 is in an ON state. That is, the first regulator 12 performs the feedback operation to control the internal power supply voltage Vout. Therefore, when the power supply switch 11 is turned off, even if the internal circuit 13 draws a large current due to any cause, the current can be instantaneously supplied to the internal circuit 13 via the P-type MOS transistor PM1. Thus, the internal power supply voltage Vout cannot rapidly lower.
(Period III: Time t2 and Thereafter)

Then, at time t2, the control signal B changes to the high level. On the other hand, the control signal A remains at the high level. Thus, the power supply switch 11 is held at an OFF state. Since the second resistor R2 is switched to a high resistance value at time t2, the target voltage of the first regulator 12 is the second voltage Vreg. Therefore, the output voltage VGp of the amplifier OP1 increases from 0 V and is controlled to be a voltage Vxp, and the internal power supply voltage Vout is controlled to be the second voltage Vreg.

That is, the internal power supply voltage Vout becomes the second voltage Vreg as a result of the operation of the first regulator 12.

At this time, the internal power supply voltage Vout can be gradually lowered from the external power supply voltage VDD to the second voltage Vreg with a time constant by the first resistor R1 and the second resistor R2 in the first regulator 12 and a capacitance of the internal circuit 13 serving as a load (fall time tf). Therefore, a large change in voltage in the transition state can be restricted.

Also in period III, the internal circuit 13 is in the standby state or low-speed operation state.

In this way, with the first regulator 12 capable of changing the setting of the target voltage (or the output voltage) and the power supply switch 11, the control in period II can be performed and the internal power supply voltage Vout can be switched without a temporary interruption of the power supply.

Figure 3:
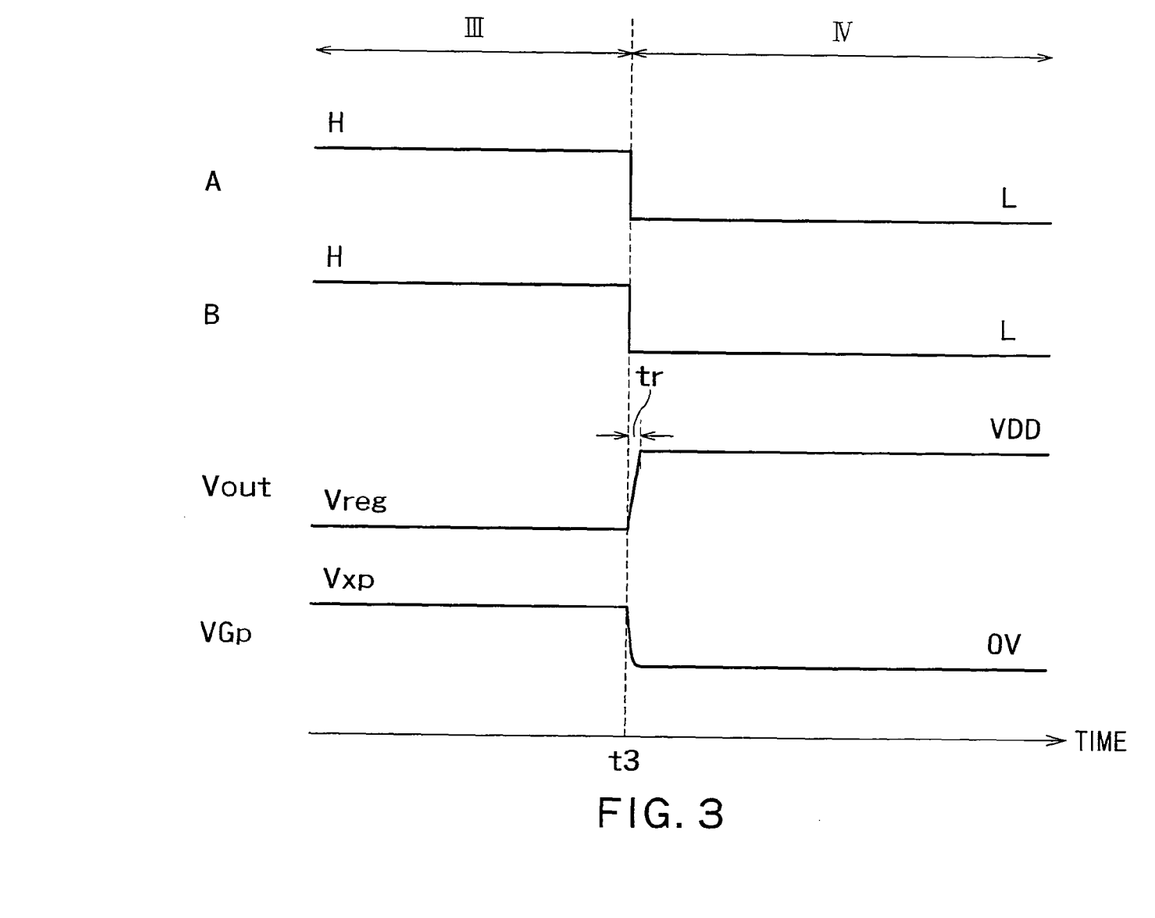
FIG. 3 is a waveform diagram showing a rise operation of the internal power supply voltage of the semiconductor device according to the first embodiment.

FIG. 3 is a waveform diagram showing a rise operation of the internal power supply voltage Vout of the semiconductor device 10 according to the first embodiment.

(Period III: Before Time t3)

The semiconductor device 10 performs the same operations as those in period III of FIG. 2. Therefore, an explanation thereof will not be repeated.

(Period IV: Time t3 and Thereafter)

At time t3, the internal circuit 13 is changed to the normal operation state, and the control signal A and the control signal B change to the low level (L) at the same time. Thus, at time t3, the power supply switch 11 is turned on and at the same time, the target voltage of the first regulator 12 becomes the first voltage. Thereby, the internal power supply voltage Vout becomes the external power supply voltage VDD as a result of the operations of both the power supply switch 11 and the first regulator 12.

It is often required that the transition from the standby state or low-speed operation state to the normal operation state is performed in a short time. Thus, the power supply switch 11 is also turned on at the same time with the change of the setting of the target voltage of the first regulator 12. Accordingly, the internal power supply voltage Vout can rise in a short time. That is, the rise time tr of the internal power supply voltage Vout is shorter than the fall time tf.

There has been described, with reference to FIG. 2, the example in which the control signal B changes from the low level to the high level after the controls signal A changes from the low level to the high level on the fall of the internal power supply voltage Vout. However, the control signal A and the control signal B may change from the low level to the high level at the same time. That is, after the power supply switch 11 is turned on and the target voltage of the first regulator 12 is set at the first voltage, the power supply switch 11 may be turned off, and at or after the point in time when the power supply switch 11 is turned off, the target voltage of the first regulator 12 may be set at the second voltage Vreg.

There has been described, with reference to FIG. 3, the example in which the control signal A and the control signal B change from the high level to the low level at the same time on the rise of the internal power supply voltage Vout. However, the control signal A may change from the high level to the low level prior to the control signal B. However, they preferably change at the same time.

As described above, according to the present embodiment, when the internal power supply voltage Vout is increased, the external power supply voltage VDD is output as the internal power supply voltage Vout via the ON-state power supply switch 11, and the target voltage of the first regulator 12 is set at the external power supply voltage VDD or more so that the first regulator 12 also outputs the external power supply voltage VDD. When the internal power supply voltage Vout is lowered, the power supply switch 11 is turned off, and at or after that point in time, the target voltage is set at the second voltage Vreg so that the first regulator 12 outputs the second voltage Vreg. Thereby, the first regulator 12 always performs the feedback operation to control the internal power supply voltage Vout irrespective of the internal power supply voltage Vout. Accordingly, the internal power supply voltage Vout can be switched without causing a temporary interruption of the power supply and a rapid variation in voltage in the transition state, thereby achieving the system using the semiconductor device 10 with low consumption.

Modification of First Embodiment

Figure 4:
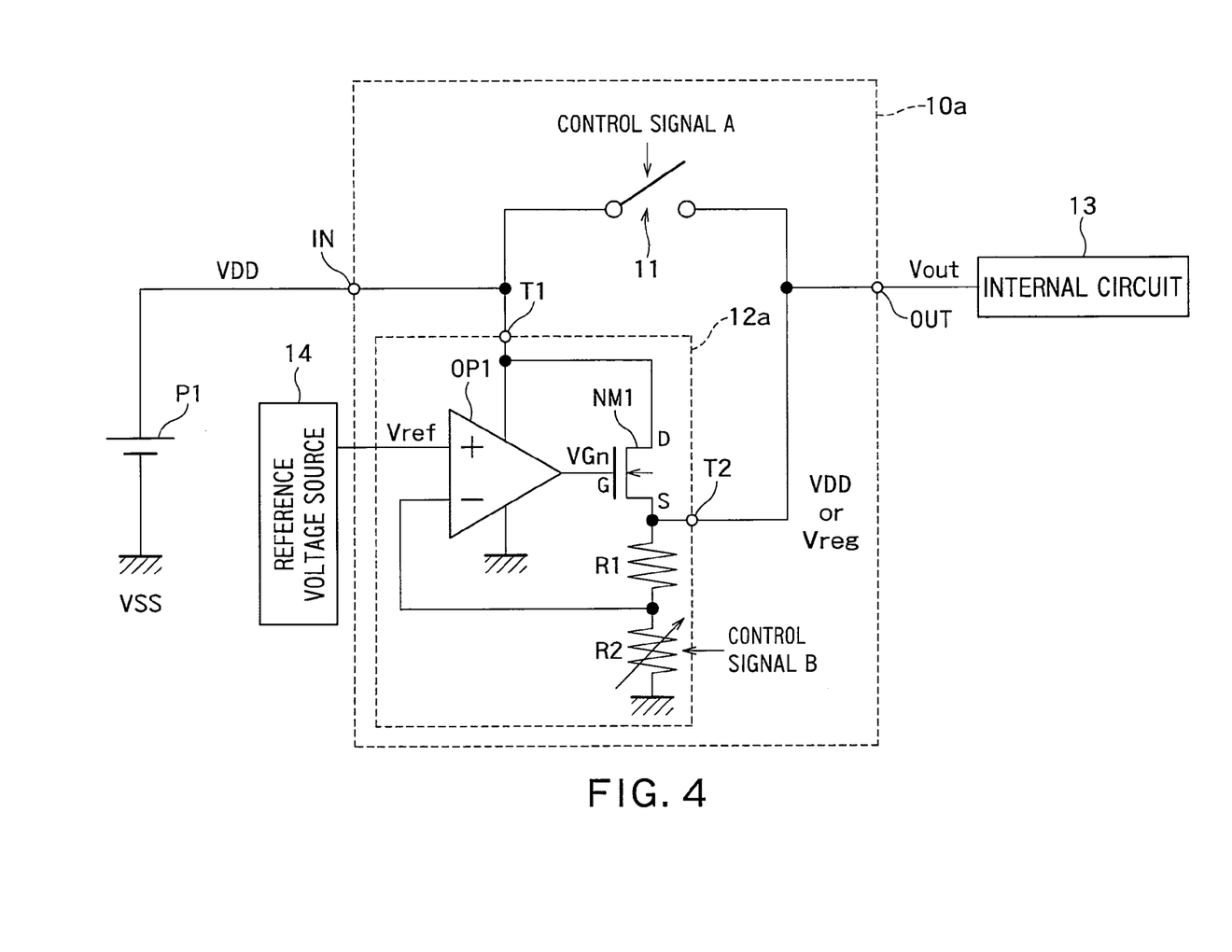
FIG. 4 is a circuit diagram showing a structure of a semiconductor device according to a modification of the first embodiment.

An N-type MOS transistor NM1 may be employed instead of the P-type MOS transistor PM1 in the first regulator 12 according to the first embodiment.

FIG. 4 is a circuit diagram showing a structure of a semiconductor device 10a according to a modification of the first embodiment. As shown in FIG. 4, the semiconductor device 10a is different from the first embodiment in the structure of a first regulator 12a.

The first regulator 12a has the N-type MOS transistor NM1, the first resistor R1, the second resistor R2 and the amplifier OP1.

A drain (one end) D of the N-type MOS transistor NM1 is connected to the power supply terminal T1, and a source (the other end) S of the N-type MOS transistor NM1 is connected to the voltage output terminal T2. One end of the first resistor R1 is connected to the source S of the N-type MOS transistor NM1. One end of the second resistor R2 is connected to the other end of the first resistor R1, and the other end of the second resistor R2 is grounded to the ground potential VSS. The second resistor R2 is a variable resistor capable of being switched to a high resistance value or a low resistance value by the control signal B.

The amplifier OP1 includes the non-inverting input terminal (the first input terminal) configured to receive the reference voltage Vref, the inverting input terminal (the second input terminal) connected to the other end of the first resistor R1, and the output terminal connected to a gate G of the N-type MOS transistor NM1. The amplifier OP1 controls a voltage VGn of the gate G of the N-type MOS transistor NM1 such that the voltage of the inverting input terminal approaches the reference voltage Vref.

Other circuit structures are the same as those of the first embodiment of FIG. 1. Thus, like constituents are denoted with like reference numerals and an explanation thereof will not be repeated.

Figure 5:
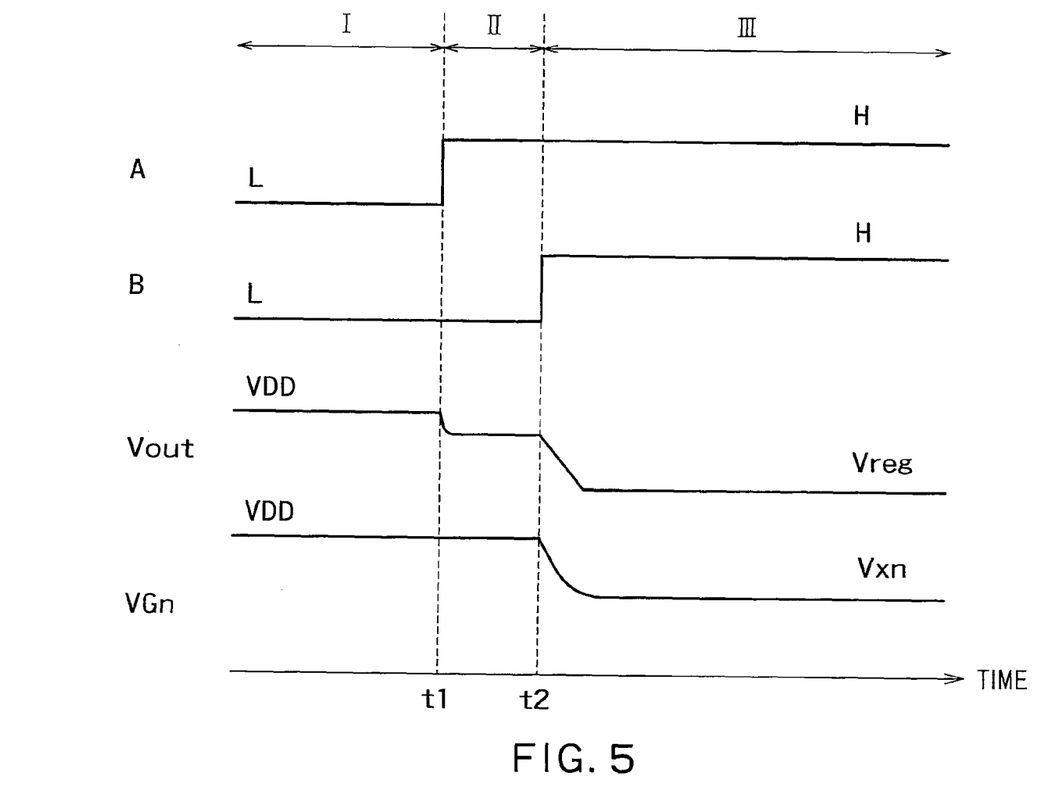
FIG. 5 is a waveform diagram showing a fall operation of the internal power supply voltage of the semiconductor device according to the modification of the first embodiment.

The operations of the semiconductor device 10a will be described below mainly on the points different from the first embodiment. FIG. 5 is a waveform diagram showing a fall operation of the internal power supply voltage Vout of the semiconductor device 10a according to the modification of the first embodiment.

(Period I)

In period I, the power supply switch 11 is in an ON state and thus the internal power supply voltage Vout is the external power supply voltage VDD. Thus, the voltage of the source S of the N-type MOS transistor NM1 is also the external power supply voltage VDD. Since the internal power supply voltage Vout at this time does not reach the target voltage, the voltage between the first resistor R1 and the second resistor R2 is lower than the reference voltage Vref. Thus, the output voltage VGn of the amplifier OP1 (the voltage of the gate G of the N-type MOS transistor NM1) is fixed at the external power supply voltage VDD as shown in FIG. 5. Therefore, the N-type MOS transistor NM1 is in an OFF state. That is, the internal power supply voltage Vout supplied to the internal circuit 13 becomes the external power supply voltage VDD as a result of the operation of the power supply switch 11.

(Period II)

When the control signal A becomes the high level and the power supply switch 11 is turned off at time t1, the internal power supply voltage Vout (the voltage of the source S of the N-type MOS transistor NM1) lowers and the N-type MOS transistor NM1 is turned on. Since the target voltage is the first voltage at this time similar to period I, the voltage VGn of the gate G of the N-type MOS transistor NM1 is controlled to be the external power supply voltage VDD. Thereby, the internal power supply voltage Vout is equal to (the external power supply voltage VDD)-(the voltage VGS between the gate and the source of the N-type MOS transistor NM1).

Since the output voltage VGn of the amplifier OP1 is fixed at VDD due to the feedback operation at time t1 when the power supply switch 11 is turned off, the N-type MOS transistor NM1 is instantaneously turned on when the internal power supply voltage Vout is lowered. Therefore, when the power supply switch 11 is turned off, even if the internal circuit 13 draws a large current due to any cause, the current can be instantaneously supplied to the internal circuit 13 via the N-type MOS transistor NM1. Thus, the internal power supply voltage Vout cannot rapidly lower.

(Period III)

Since the control signal B becomes the high level and the second resistor R2 is switched to a high resistance value at time t2, the target voltage becomes the second voltage Vreg. Thus, the output voltage VGn of the amplifier OP1 decreases from VDD and is controlled to be a voltage Vxn, and the internal power supply voltage Vout is controlled to be the second voltage Vreg. That is, the internal power supply voltage Vout becomes the second voltage Vreg as a result of the operation of the first regulator 12a.

Also with the modification, similar to the first embodiment, the internal power supply voltage Vout can be switched without causing a temporary interruption of the power supply and a rapid variation in voltage in the transition state, thereby achieving the system using the semiconductor device 10 with low consumption.

Second Embodiment

Figure 6:
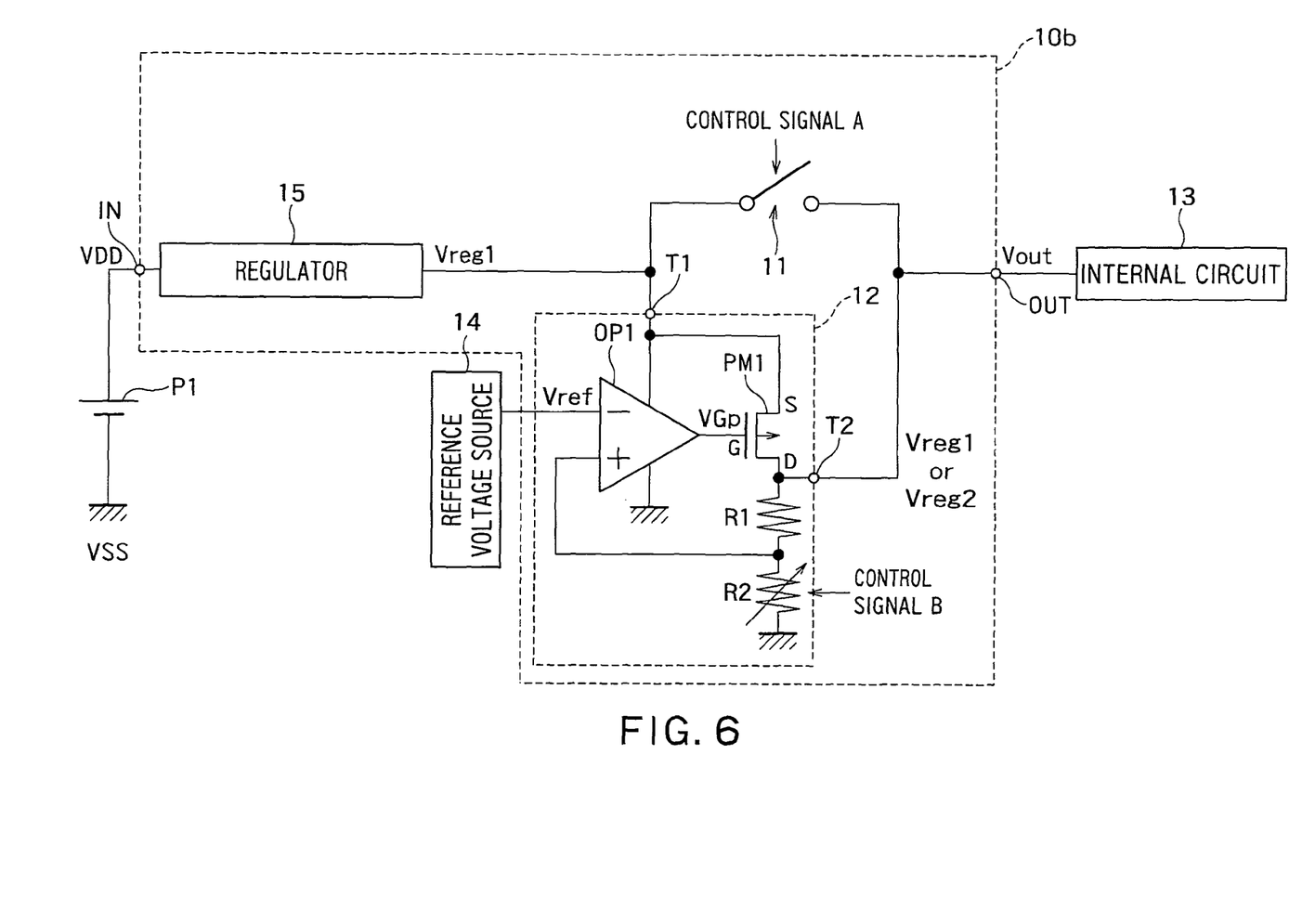
FIG. 6 is a circuit diagram showing a structure of a semiconductor device according to a second embodiment.

A second embodiment is different from the first embodiment in that a second regulator 15 is further provided.

FIG. 6 is a circuit diagram showing a structure of a semiconductor device 10b according to the second embodiment. The semiconductor device 10b comprises the second regulator 15 in addition to what is included in the semiconductor device 10 of FIG. 1.

The second regulator 15 is connected between the input terminal IN and one end of the power supply switch 11. The second regulator 15 lowers the external power supply voltage VDD, and supplies a lowered voltage Vreg1 to one end of the power supply switch 11 and the power supply terminal T1 of the first regulator 12. Other circuit structures are the same as those of the first embodiment. Thus, like constituents are denoted with like reference numerals and an explanation thereof will not be repeated.

In the present embodiment, the second resistor R2 is switched to a low resistance value by the control signal B so that the target voltage is set at the first voltage equal to or more than the voltage Vreg1 of the power supply terminal T1. The second resistor R2 is switched to a high resistance value by the control signal B so that the target voltage is set at a second voltage Vreg2 lower than the voltage Vreg1 of the power supply terminal T1.

Thereby, when the control signal A and the control signal B are at the low level, the internal power supply voltage Vout becomes the voltage Vreg1 as a result of the operations of both the power supply switch 11 and the first regulator 12.

When the control signal A is at the high level and the control signal B is at the low level, the internal power supply voltage Vout becomes the voltage Vreg1 as a result of the operation of the first regulator 12.

When the control signal A and the control signal B are at the high level, the internal power supply voltage Vout becomes the second voltage Vreg2 as a result of the operation of the first regulator 12.

In this way, in the present embodiment, since the voltage Vreg1 lower than the external power supply voltage VDD is supplied to the power supply terminal T1 of the first regulator 12, a variable range (from 0 V to the voltage Vreg1) of the output voltage VGp of the amplifier OP1 is narrower than that of the first embodiment. Thus, a rapid variation in voltage can be accurately restricted during the fall operation of the internal power supply voltage Vout.

Additionally, effects similar to the first embodiment can be obtained.

Third Embodiment

Figure 7:
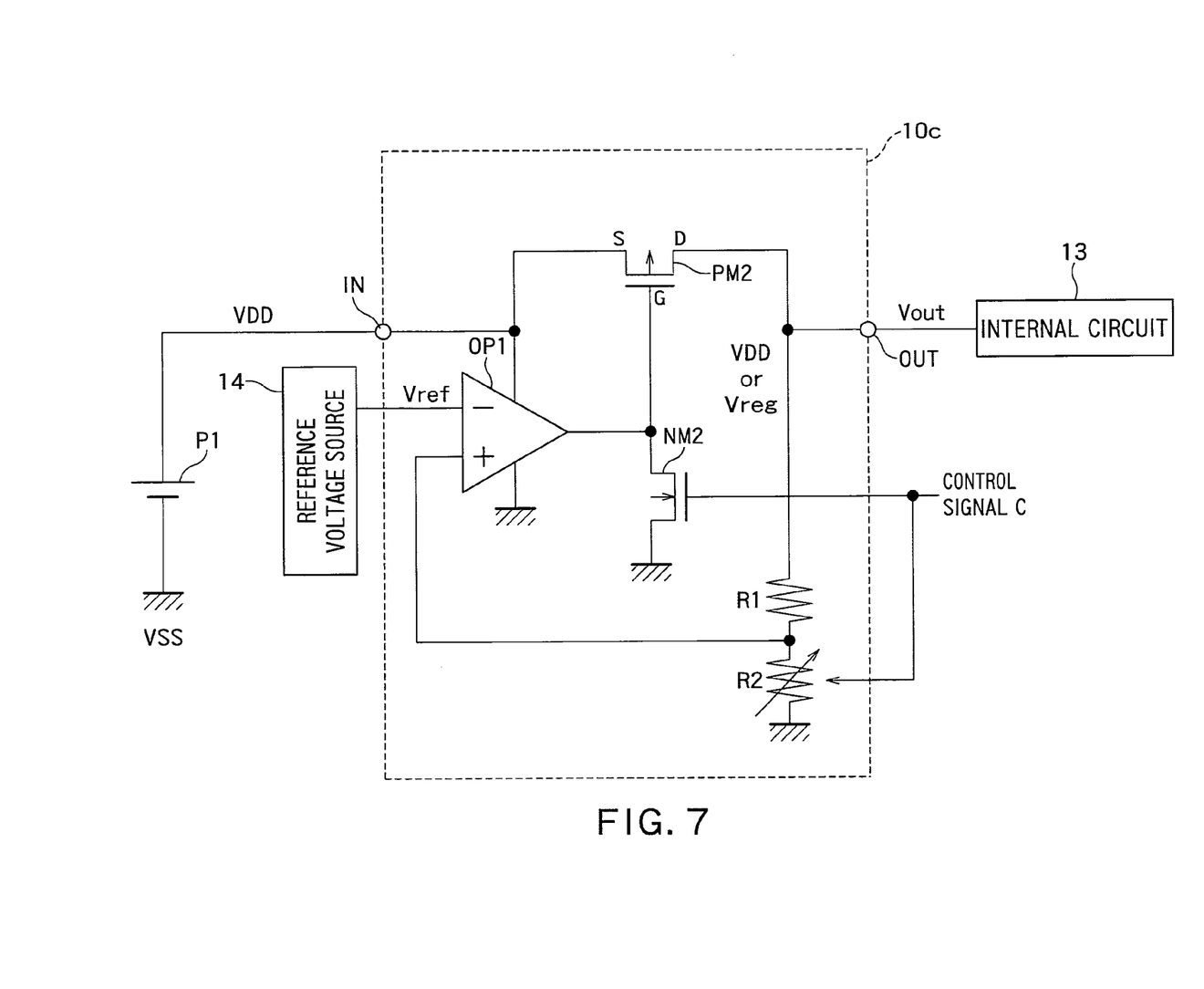
FIG. 7 is a circuit diagram showing a structure of a semiconductor device according to a third embodiment.

A third embodiment is different from the first embodiment in that the power supply switch 11 is not provided.

FIG. 7 is a circuit diagram showing a structure of a semiconductor device 10c according to the third embodiment. The semiconductor device 10c comprises a P-type MOS transistor PM2, the first resistor R1, the second resistor R2, the amplifier OP1 and an N-type MOS transistor (switch) NM2.

The semiconductor device 10c outputs the internal power supply voltage Vout equal to or less than the external power supply voltage VDD from the output terminal OUT, based on the external power supply voltage VDD supplied from the external power supply P1 to the input terminal IN.

A source S of the P-type MOS transistor PM2 is connected to the input terminal IN, and a drain D of the P-type MOS transistor PM2 is connected to the output terminal OUT. One end of the first resistor R1 is connected to the drain D of the P-type MOS transistor PM2. One end of the second resistor R2 is connected to the other end of the first resistor R1, and the other end of the second resistor R2 is grounded. The second resistor R2 is a variable resistor capable of being switched to a high resistance value or a low resistance value by a control signal C. In the present embodiment, the second resistor R2 is at a high resistance value when the control signal C is at a low level, and is at a low resistance value when the control signal C is at a high level.

The amplifier OP1 includes the inverting input terminal configured to receive the reference voltage Vref, the non-inverting input terminal connected to the other end of the resistor R1, and the output terminal connected to the gate G of the P-type MOS transistor PM2. The power supply terminal of the amplifier OP1 is connected to the input terminal IN. The drain (one end) of the N-type MOS transistor NM2 is connected to the gate G of the P-type MOS transistor PM2, the source (the other end) of the N-type MOS transistor NM2 is grounded. The gate of the N-type MOS transistor NM2 is supplied with the control signal C.

With the structure, the semiconductor device 10c controls such that the internal power supply voltage Vout approaches the target voltage. The target voltage is determined based on the first resistor R1, the second resistor R2 and the reference voltage Vref, and can be expressed as $(R_1/R_2+1)$Vref, where $R_1$ is the resistance value of the first resistor R1 and $R_2$ is the resistance value of the second resistor R2. The target voltage can be switched to the first voltage equal to or more than the external power supply voltage VDD or the second voltage Vreg lower than the external power supply voltage VDD by the control signal C. The first resistor R1, the second resistor R2 and the reference voltage Vref are set such that when the second resistor R2 is set at a low resistance value, the target voltage is set at the first voltage; and when the second resistor R2 is set at a high resistance value, the target voltage is set at the second voltage Vreg.

When the target voltage is at the first voltage, the N-type MOS transistor NM2 is controlled to be turned on by the control signal C. When the target voltage is at the second voltage Vreg, the N-type MOS transistor NM2 is controlled to be turned off.

Figure 8:
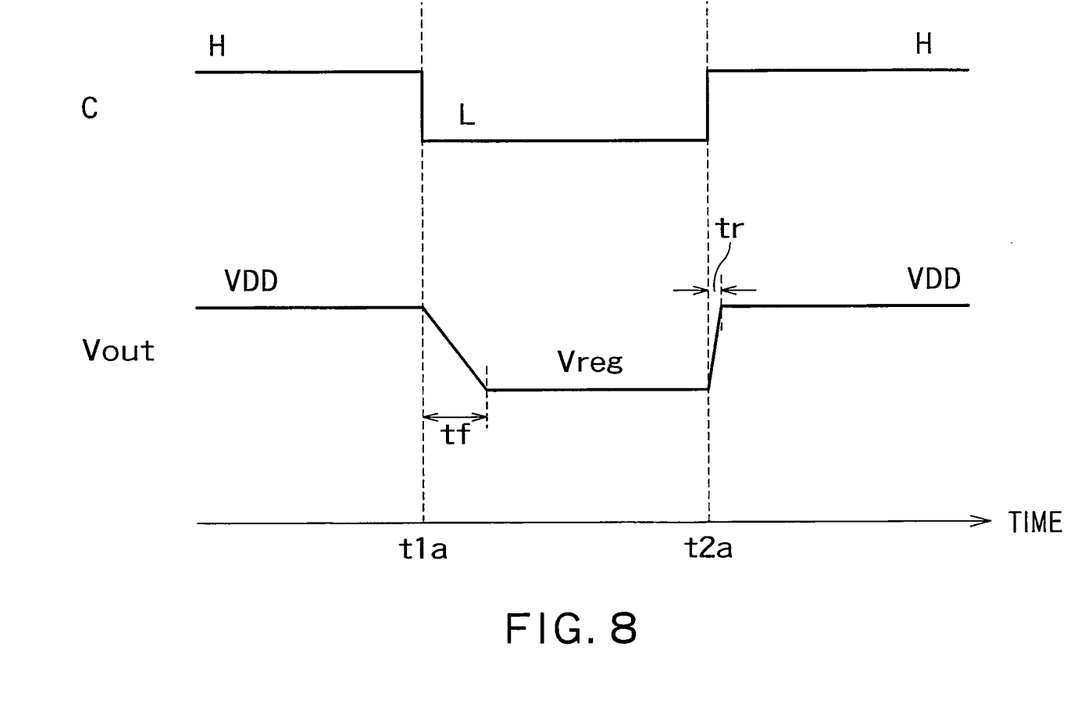
FIG. 8 is a waveform diagram showing the operations of the semiconductor device according to the third embodiment.

FIG. 8 is a waveform diagram showing the operations of the semiconductor device 10c according to the third embodiment.

Before time t1a, the control signal C is at the high level. Therefore, the N-type MOS transistor NM2 is in an ON state and thus the voltage of the gate G of the P-type MOS transistor PM2 is at 0 V. Thereby, the P-type MOS transistor PM2 is turned on, and thus the external power supply voltage VDD is output as the internal power supply voltage Vout.

Since the second resistor R2 is set at a low resistance value, the target voltage is at the first voltage higher than the external power supply voltage VDD. At this time, the voltage between the first resistor R1 and the second resistor R2 is lower than the reference voltage Vref, and thus the amplifier OP1 outputs 0 V.

Then, at time t1a, the control signal C changes from the high level to the low level. Thereby, the N-type MOS transistor NM2 enters an OFF state. The second resistor R2 is set at a high resistance value so that the target voltage is at the second voltage Vreg. Therefore, the internal power supply voltage Vout is controlled to be the second voltage Vreg.

At this time, the internal power supply voltage Vout can be gradually lowered from the external power supply voltage VDD to the second voltage Vreg with a time constant by the first resistor R1, the second resistor R2 and a capacitance of the internal circuit 13 serving as a load (fall time tf). Thus, a large variation in voltage in the transition state can be restricted.

Then, at time t2a, the control signal C changes from the low level to the high level. Thereby, like the state before time t1a, the N-type MOS transistor NM2 is turned on. The second resistor R2 is set at a low resistance value so that the target voltage is at the first voltage. Thus, the external power supply voltage VDD is output as the internal power supply voltage Vout.

As described above, according to the present embodiment, the power supply switch 11 and the P-type MOS transistor PM1 according to the first embodiment are replaced with the P-type MOS transistor PM2, thereby making the semiconductor device 10c smaller in size than the semiconductor device 10 according to the first embodiment.

Additionally, effects similar to the first embodiment can be obtained.

Fourth Embodiment

Figure 9:
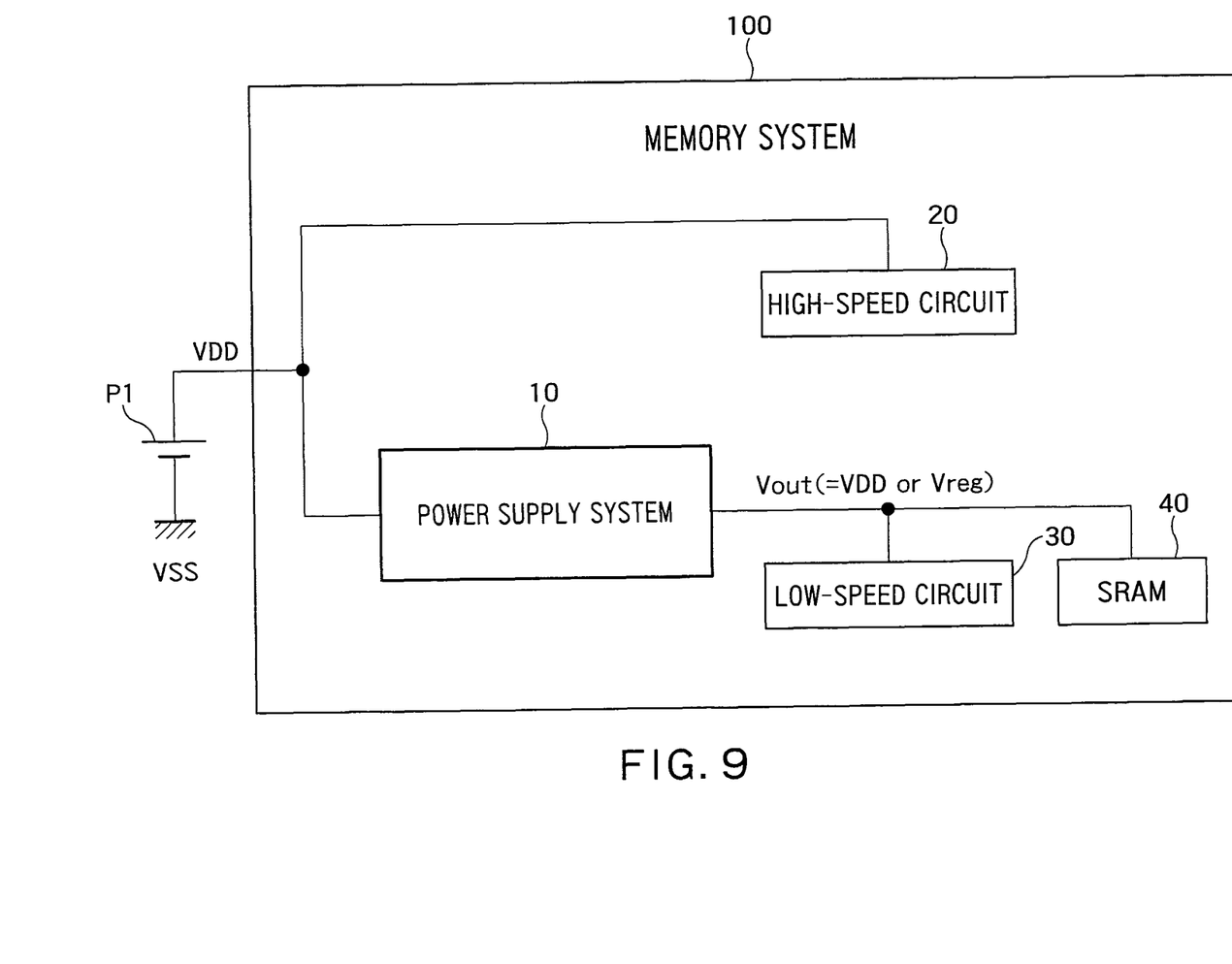
FIG. 9 is a block diagram showing a structure of a memory system according to a fourth embodiment.

A fourth embodiment relates to an example of a system using the semiconductor device 10 according to the first embodiment.

FIG. 9 is a block diagram showing a structure of a memory system 100 according to the fourth embodiment of the present invention. As shown in FIG. 9, the memory system 100 comprises the semiconductor device (power supply system) 10 according to the first embodiment, a high-speed circuit 20, a low-speed circuit 30 and a SRAM (memory) 40.

The memory system 100 is a memory controller for controlling a NAND flash memory (not shown), for example. The memory system 100 can be switched to the normal operation state or the standby state.

The external power supply P1 supplies the external power supply voltage VDD to the semiconductor device 10 and the high-speed circuit 20.

The high-speed circuit 20 is a CPU or a logic circuit, for example, and controls the NAND flash memory. The high-speed circuit 20 stops operating in the standby state.

The semiconductor device 10 outputs the internal power supply voltage Vout based on the external power supply voltage VDD. The internal power supply voltage Vout is supplied to the low-speed circuit 30 and the SRAM 40 as the power supply voltage for operating the low-speed circuit 30 and the SRAM 40. The semiconductor device 10 outputs the external power supply voltage VDD, as the internal power supply voltage Vout, in the normal operation state, and outputs the second voltage Vreg lower than the external power supply voltage VDD, as the internal power supply voltage Vout, in the standby state.

The low-speed circuit 30 is a logic circuit, for example, and operates at a lower speed than the high-speed circuit 20. The low-speed circuit 30 controls the SRAM 40 or the NAND flash memory.

The SRAM 40 temporarily stores information read from the NAND flash memory, for example. The SRAM 40 temporarily stores a signal (data) input from the outside, and transfers it to the NAND flash memory. Further, the SRAM 40 stores the setting data of the memory system 100 therein. The SRAM 40 needs to operate at a high speed in the normal operation state, and needs to keep holding the stored data in the standby state.

As described above, according to the semiconductor device 10 according to the first embodiment, the internal power supply voltage Vout can be switched to the external power supply voltage VDD or the second voltage Vreg without causing a temporary interruption of the power supply and a rapid variation in voltage in the transition state. Therefore, the memory system 100 with low power consumption can be achieved without destroying the data stored in the SRAM 40.

The internal power supply voltage Vout is switched to the second voltage Vreg so that a leak current of the SRAM 40 in the standby state can be reduced.

Similar effects can be obtained even with the semiconductor device 10a, 10b, 10c according to other embodiments, instead of the semiconductor device 10 according to the first embodiment.

(Other Modification)

There has been described in the respective embodiments that the second resistor R2 is switched to a high resistance value or a low resistance value by the control signal B, thereby switching the target voltage. However, the reference voltage Vref may be switched by the control signal B, thereby switching the target voltage. Additionally, the first resistor R1 may be switched to a high resistance value or a low resistance value by the control signal B.

The modification of the first embodiment may be applied to the second embodiment. The second embodiment and the third embodiment may be combined.

Further, the semiconductor device 10, 10a, 10b or 10c may be applied to a system other than the memory system 100.

With the semiconductor device according to each embodiment described above, the internal power supply voltage Vout can be switched without causing a temporary interruption of the power supply and a rapid variation in voltage in the transition state.

Comparative Example

A comparative example known by the inventor of the present invention will be described below.

Figure 10:
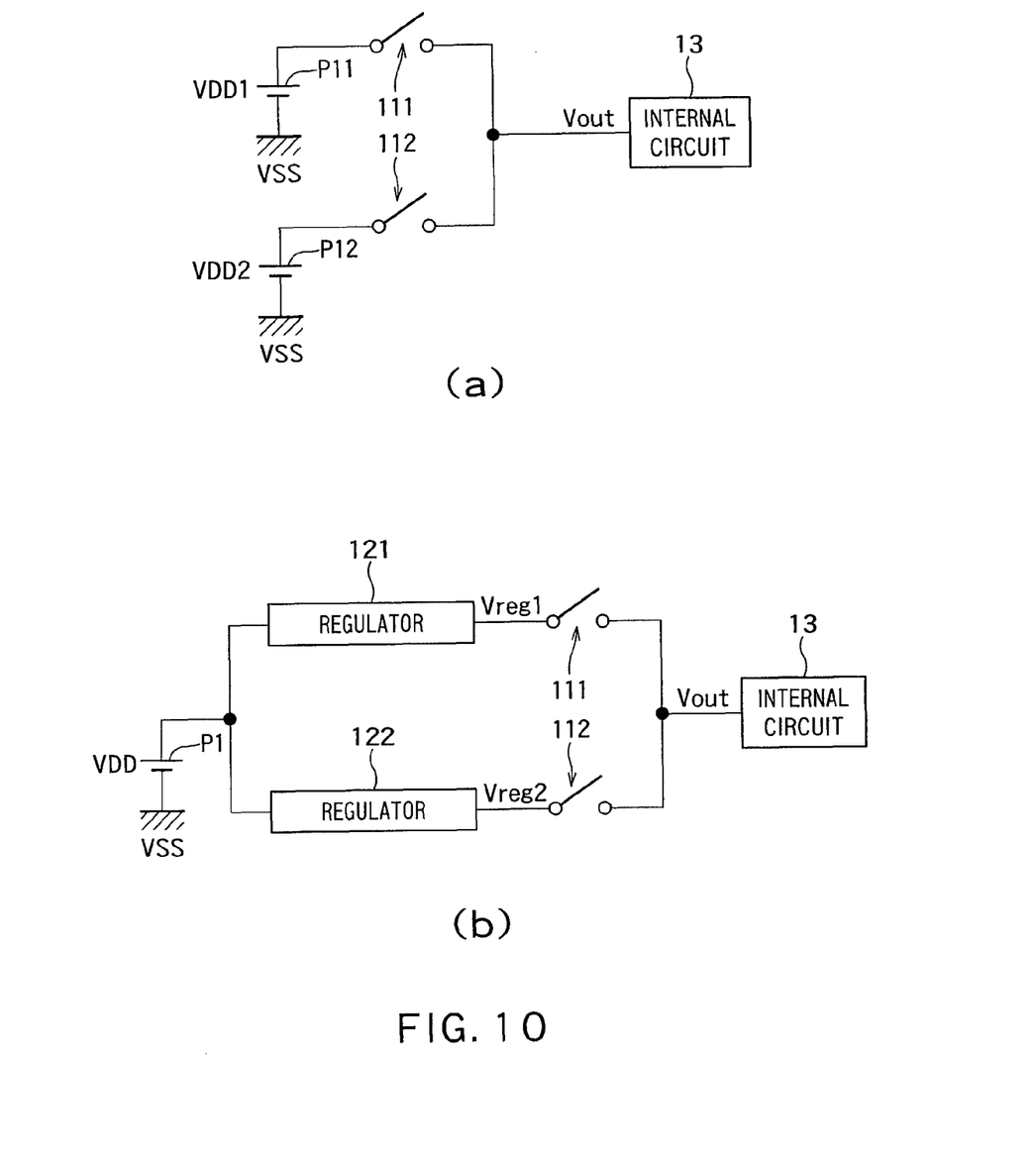
FIG. 10 is a block diagram showing a structure of a power supply system according to a comparative example.

FIG. 10 is a block diagram showing a structure of a power supply system according to the comparative example. The power supply system shown in FIG. 10 (a) comprises two external power supplies P11 and P12 and two power supply switches 111 and 112. When the power supply switch 111 is in an ON state, a power supply voltage VDD1 from the external power supply P11 is supplied to the internal circuit 13 as the internal power supply voltage Vout. When the power supply switch 112 is in an ON state, a power supply voltage VDD2 (<VDD1) from the external power supply P12 is supplied to the internal circuit 13 as the internal power supply voltage Vout.

The power supply system shown in FIG. 10 (b) comprises the external power supply P1, two regulators 121 and 122, and the two power supply switches 111 and 112. When the power supply switch 111 is in the ON state, the voltage Vreg1 (<VDD), obtained by adjusting the power supply voltage VDD from the external power supply P1, is supplied to the internal circuit 13 as the internal power supply voltage Vout. When the power supply switch 112 is in the ON state, the voltage Vreg2 (<Vreg1), obtained by adjusting the power supply voltage VDD from the external power supply P1, is supplied to the internal circuit 13 as the internal power supply voltage Vout.

In the power supply system according to the comparative example shown in FIGS. 10 (a) and 10 (b), the power supply temporarily interrupts at the moment when the power supply switches 111 and 112 are turned off at the same time. Even in a case where the power supply switches 111 and 112 are controlled not to be turned off at the same time, in the power supply system according to the comparative example shown in FIG. 10 (b), when the power supply switch 111 is turned off and the power supply switch 112 is turned on while the internal power supply voltage Vout is at the voltage Vreg1, the regulator 122 does not perform the feedback operation for increasing the internal power supply voltage Vout until the internal power supply voltage Vout lowers to less than the voltage Vreg2. Thus, when the internal circuit 13 draws a large current at this time, the internal power supply voltage Vout can rapidly lower after the internal power supply voltage Vout is reduced to less than the voltage Vreg2 until the regulator 122 starts the feedback operation for increasing the internal power supply voltage Vout.

In other words, with the structure of the comparative example, unlike the structures of the above-described embodiments, a temporary interruption of the power supply and a rapid variation in voltage in the transition state can occur.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device configured to output an internal power supply voltage from an output terminal based on an external power supply voltage supplied to an input terminal, comprising:
    a power supply switch, one end of the power supply switch being connected to the input terminal, the other end of the power supply switch being connected to the output terminal, and the power supply switch being controlled to be on or off; and
    a first regulator comprising a power supply terminal and a voltage output terminal, the power supply terminal being connected to the one end of the power supply switch, the voltage output terminal being connected to the other end of the power supply switch, the first regulator configured to control a voltage of the voltage output terminal to approach a target voltage based on a voltage of the power supply terminal, the target voltage being switched to a first voltage or a second voltage, the first voltage being equal to or more than the voltage of the power supply terminal, the second voltage being lower than the voltage of the power supply terminal,
    wherein after the power supply switch is controlled to be on and the target voltage of the first regulator is set at the first voltage, the power supply switch is controlled to be off, and
    at or after the point in time when the power supply switch is controlled to be off, the target voltage of the first regulator is set at the second voltage.

2. The semiconductor device according to claim 1, wherein the first regulator comprises:
    a MOS transistor, one end of the MOS transistor being connected to the power supply terminal, the other end of the MOS transistor being connected to the voltage output terminal;
    a first resistor, one end of the first resistor being connected to the other end of the MOS transistor;
    a second resistor, one end of the second resistor being connected to the other end of the first resistor, the other end of the second resistor being grounded; and
    an amplifier, comprising a first input terminal configured to receive a reference voltage, a second input terminal connected to the other end of the first resistor, and an output terminal connected to a gate of the MOS transistor,
    the amplifier controlling a voltage of the gate of the MOS transistor such that a voltage of the second input terminal approaches the reference voltage, and
    the target voltage being determined based on the first resistor, the second resistor and the reference voltage.

3. The semiconductor device according to claim 2, wherein the MOS transistor is a P-type MOS transistor,
    a source of the P-type MOS transistor is connected to the power supply terminal, and a drain of the P-type MOS transistor is connected to the voltage output terminal,
    the first input terminal of the amplifier is an inverting input terminal, and
    the second input terminal of the amplifier is a non-inverting input terminal.

4. The semiconductor device according to claim 2, wherein the MOS transistor is an N-type MOS transistor,
    a drain of the N-type MOS transistor is connected to the power supply terminal, and a source of the N-type MOS transistor is connected to the voltage output terminal,
    the first input terminal of the amplifier is a non-inverting input terminal, and
    the second input terminal of the amplifier is an inverting input terminal.

5. The semiconductor device according to claim 2, wherein the second resistor is a variable resistor, the variable resistor is switched to a high resistance value or a low resistance value by a control signal.

6. The semiconductor device according to claim 2, wherein the target voltage is expressed as $(R_1/R_2+1)Vref$, where $R_1$ is a resistance value of the first resistor, $R_2$ is a resistance value of the second resistor, and Vref is the reference voltage.

7. The semiconductor device according to claim 2, wherein a power supply terminal of the amplifier is connected to the power supply terminal.

8. The semiconductor device according to claim 2, wherein the power supply switch comprises a MOS transistor larger in size than the MOS transistor of the first regulator.

9. The semiconductor device according to claim 2, wherein the reference voltage is switched by a control signal, thereby switching the target voltage.

10. The semiconductor device according to claim 1, further comprising a second regulator connected between the input terminal and the one end of the power supply switch, the second regulator is configured to reduce the external power supply voltage, and the second regulator is configured to supply a reduced voltage to the one end of the power supply switch and the power supply terminal of the first regulator.

11. The semiconductor device according to claim 1, wherein the power supply switch is controlled to be off and, at the same time, the target voltage of the first regulator is set at the second voltage.

12. The semiconductor device according to claim 1, wherein after the power supply switch is controlled to be off and the target voltage of the first regulator is set at the second voltage, the power supply switch is controlled to be on, and
at or after the point in time when the power supply switch is controlled to be on, the target voltage of the first regulator is set at the first voltage.

13. The semiconductor device according to claim 1, wherein after the power supply switch is controlled to be off and the target voltage of the first regulator is set at the second voltage, the power supply switch is controlled to be on, and
the power supply switch is controlled to be on and, at the same time, the target voltage of the first regulator is set at the first voltage.

14. A semiconductor device configured to control an internal power supply voltage output from an output terminal to approach a target voltage, based on an external power supply voltage supplied to an input terminal, comprising:
a P-type MOS transistor, a source of the P-type MOS transistor being connected to the input terminal, a drain of the P-type MOS transistor being connected to the output terminal;
a first resistor, one end of the first resistor being connected to the drain of the P-type MOS transistor;
a second resistor, one end of the second resistor being connected to the other end of the first resistor, the other end of the second resistor being grounded;
an amplifier, comprising an inverting input terminal configured to receive a reference voltage, a non-inverting input terminal connected to the other end of the first resistor, and an output terminal connected to a gate of the P-type MOS transistor; and
a switch, one end of the switch being connected to the gate of the P-type MOS transistor, the other end of the switch being grounded,
wherein the target voltage is determined based on the first resistor, the second resistor and the reference voltage, the target voltage is switched to a first voltage or a second voltage, the first voltage is equal to or more than the external power supply voltage, and the second voltage is lower than the external power supply voltage,
the switch is controlled to be on when the target voltage is at the first voltage, and
the switch is controlled to be off when the target voltage is at the second voltage.

15. The semiconductor device according to claim 14, wherein the second resistor is a variable resistor, the variable resistor is switched to a high resistance value or a low resistance value by a control signal.

16. The semiconductor device according to claim 15, wherein
the switch is an N-type MOS transistor, and
a drain of the N-type MOS transistor is connected to the gate of the P-type MOS transistor, a source of the N-type MOS transistor is grounded, and a gate of the N-type MOS transistor is supplied with the control signal.

17. The semiconductor device according to claim 14, wherein the target voltage is expressed as $(R_1/R_2+1)V\text{ref}$, where $R_1$ is a resistance value of the first resistor, $R_2$ is a resistance value of the second resistor, and Vref is the reference voltage.

18. The semiconductor device according to claim 14, wherein a power supply terminal of the amplifier is connected to the input terminal.

19. A memory system comprising:
a memory; and
a semiconductor device according to claim 1, configured to supply the internal power supply voltage to the memory.

20. The memory system according to claim 19, wherein
the memory system operates in a normal operation state or a standby state, and
the target voltage of the first regulator is set at the first voltage in the normal operation state, and the target voltage of the first regulator is set at the second voltage in the standby state.

* * * * *